United States Patent
Lavrova et al.

(10) Patent No.: US 9,768,338 B2
(45) Date of Patent: Sep. 19, 2017

(54) MULTI-SOURCE OPTIMAL RECONFIGURABLE ENERGY HARVESTER

(71) Applicant: STC.UNM, Albuquerque, NM (US)

(72) Inventors: Olga A. Lavrova, Albuquerque, NM (US); Christos G. Christodoulou, Albuquerque, NM (US); Sang M. Han, Albuquerque, NM (US); Ganesh Balakrishnan, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 212 days.

(21) Appl. No.: 14/373,687

(22) PCT Filed: Jan. 23, 2013

(86) PCT No.: PCT/US2013/022760
§ 371 (c)(1),
(2) Date: Jul. 22, 2014

(87) PCT Pub. No.: WO2013/112596
PCT Pub. Date: Aug. 1, 2013

(65) Prior Publication Data
US 2014/0366927 A1 Dec. 18, 2014

Related U.S. Application Data (60) Provisional application No. 61/589,440, filed on Jan. 23, 2012.

(51) Int. Cl.
*H01L 31/042* (2014.01)
*H01L 31/0725* (2012.01)
(Continued)

(52) U.S. Cl.
CPC ........ *H01L 31/0725* (2013.01); *H01L 31/043* (2014.12); *H01L 31/0735* (2013.01);
(Continued)

(58) Field of Classification Search
CPC ...... H02J 17/00; H02S 10/30; H01L 31/0745; H01Q 9/27; H01Q 1/248
(Continued)

(56) References Cited

U.S. PATENT DOCUMENTS

| | | | |
|---|---|---|---|
| 6,077,722 A * | 6/2000 | Jansen | B32B 17/10036 136/249 |
| 7,053,293 B2 | 5/2006 | Uppal | |

(Continued)

FOREIGN PATENT DOCUMENTS

JP      2002-368244      12/2002

OTHER PUBLICATIONS

International Search Report dated May 30, 2013 from International Application No. PCT/US2013/022760, pp. 1-12.

*Primary Examiner* — Jeffrey T Barton
*Assistant Examiner* — Niki Bakhtiari
(74) *Attorney, Agent, or Firm* — MH2 Technology Law Group, LLP (57) ABSTRACT

Provided is an energy harvesting device, including a solar cell including at least one active layer for receiving a first range of electromagnetic frequencies, at least one layer including antenna structures for receiving RF energy and formed on a first side of the solar cell, and at least one semiconductor for absorbing IR energy, and formed on a second side of the solar cell opposite the first side.

12 Claims, 9 Drawing Sheets

(51) Int. Cl.

| | |
|---|---|
| *H02J 17/00* | (2006.01) |
| *H01Q 1/24* | (2006.01) |
| *H01Q 9/27* | (2006.01) |
| *H01L 31/0735* | (2012.01) |
| *H01L 31/0745* | (2012.01) |
| *H01L 31/18* | (2006.01) |
| *H02S 10/30* | (2014.01) |
| *H01L 31/108* | (2006.01) |
| *H01L 31/043* | (2014.01) |

(52) U.S. Cl.
CPC ...... *H01L 31/0745* (2013.01); *H01L 31/1085* (2013.01); *H01L 31/1804* (2013.01); *H01Q 1/248* (2013.01); *H01Q 9/27* (2013.01); *H02J 17/00* (2013.01); *H02S 10/30* (2014.12); *Y02E 10/547* (2013.01); *Y02P 70/521* (2015.11)

(58) Field of Classification Search
USPC .................................................. 136/200–265
See application file for complete search history.

(56) References Cited

U.S. PATENT DOCUMENTS

| | | |
|---|---|---|
| 2007/0104888 A1 | 5/2007 | Mazen et al. |
| 2007/0160747 A1 | 7/2007 | Mitzi et al. |
| 2008/0087326 A1 | 4/2008 | Scholes et al. |
| 2008/0230112 A1* | 9/2008 | Barnham ............. H01L 31/061 136/249 |
| 2011/0277805 A1* | 11/2011 | Novack ................. H01Q 1/248 136/243 |
| 2011/0284059 A1* | 11/2011 | Celanovic ............. H02S 10/30 136/253 |

* cited by examiner

MULTI-SOURCE OPTIMAL RECONFIGURABLE ENERGY HARVESTER

RELATED APPLICATIONS

This application is a U.S. National Stage application of PCT/US2013/022760 filed Jan. 23, 2013, and claims priority from U.S. Provisional Patent Application Ser. No. 61/589,440, filed Jan. 23, 2012, the entire disclosures of which are hereby incorporated by reference in their entireties.

GOVERNMENT SUPPORT STATEMENT

This invention was made with government support under NSF Grant No. CHE1231046 awarded by the National Science Foundation. The government has certain rights in the invention.

FIELD OF THE INVENTION

This invention relates generally to the field of energy conversion, particularly energy harvesting, and specifically to the field of harvesting energy from multiple sources of energy.

BACKGROUND OF THE INVENTION

Energy harvesting is the practice of capturing energy, converting or rectifying it into usable electrical power, for example DC (direct current power), and storing or using the converted electrical power. There are many sources of ambient energy in urban environments that can be harvested. These sources of energy include, but are not limited to, heat and electromagnetic energy.

The concept of rectification of microwave signals to DC power is known. Conventionally, high power microwave energy has been beamed to power airplanes, helicopters and even satellites. In order to convert electromagnetic energy into usable DC power, the received signals that create an induced AC (alternating current) in an antenna must be rectified to produce the DC power.

Figure 1:
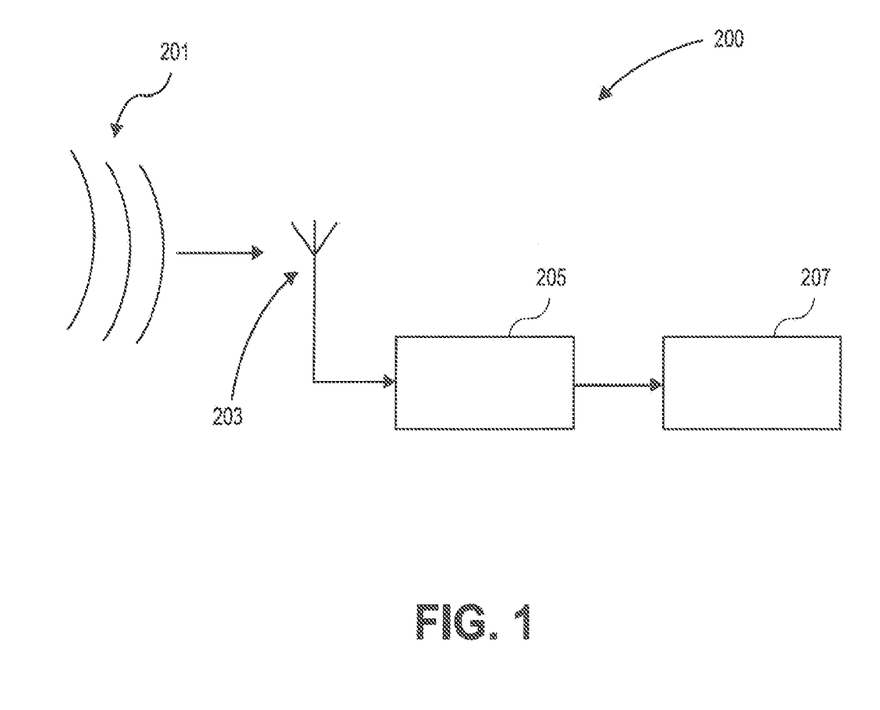
FIG. 1 illustrates a conventional rectenna arrangement.

RF (Radio Frequency) energy is widely available for harvesting. RF energy, such as that used in Wi-Fi, TV signals, Wi-Max and cellular networks is scattered in all directions and available at various frequencies. Thus, recent work has focused on the design of rectennas (antennas attached to rectifiers) specifically for RF harvesting purposes. For example, as shown in the conventional RF energy harvester 200 of FIG. 1, a receiving antenna 203 capable of collecting electromagnetic (EM) energy within the frequency band of 700 MHz to 3 GHz is attached to rectifier 205. The receiving antenna 203 receives incident EM wave 201 comprising, for example, RF energy which induces an AC response in the antenna. The rectifier 205 rectifies the AC current into DC current which can then be transferred to a storage device 207, such as a battery, which is attached to rectifier 205.

Solar energy is a high energy source that can be converted by a photovoltaic (PV) device into electrical energy and used for charging batteries, for example, lithium-ion or other types of batteries of mobile devices that include solar integrated chargers. However, in some environments, such use can be limited by the availability of a light emitter, such as the sun.

Heat can also be harvested by capturing ambient heat, such as heat from stoves and heaters. Various machines and electronics also emit heat that can be harvested by, for example, a thermophotovoltaic (TPV) device, such as a Low-temperature thermophotovoltaic (LT-TPV) device.

Conventional energy harvesters are limited by the shortcomings of their designs, such as being limited to capture from only one source of energy. They are also limited by their inability to optimize the capture of energy emanating from different directions, different sources and at different times. Additionally, conventional energy harvesters are limited by variables of a particular environment, such as the energy density of a particular kind of energy. What is needed in the art, therefore, is a multifunctional and reconfigurable energy harvester that can achieve higher efficiencies than conventional energy harvesters.

SUMMARY

In an embodiment, there is an energy harvesting device. The energy harvesting device can include a top layer comprising antenna structures formed thereon, a bottom layer, and a first semiconductor layer formed between the top and bottom layer.

In another embodiment there is a multifunction, reconfigurable energy harvesting device. In such a device, the following can be included: a broadband antenna for capturing RF energy; a solar cell for capturing solar energy; and a low-temperature thermophotovoltaic layer for capturing ambient thermal heat. The broadband antenna, solar cell and low temperature thermophotovoltaic layer can be electrically interconnected.

In yet another embodiment, there is a method of forming an energy harvesting device. The method can include exposing a surface of a Si layer of a solar cell to a chemical oxidizer. The method can also include forming $SiO_2$ collection pads on the Si layer. The method can also include nucleating Ge around a perimeter of the $SiO_2$ collection pads on the Si layer. The method can also include removing the SiO2 collection pads.

Advantages of at least one embodiment include an energy harvester that can be lightweight and/or portable. An advantage of at least one embodiment includes a cost-efficient energy harvester. An advantage of an embodiment includes an energy harvester that has the ability to receive, convert and/or store multiple sources of various types of energy, including wire-free sources of energy. An advantage of an embodiment includes an energy harvester that can adapt with the changing availability of energy sources to optimally harvest energy; and increase a yield power output.

Additional advantages of the embodiments will be set forth in part in the description which follows, and in part will be understood from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

FIG. 4B shows an ultra wideband S11 characteristic of the spiral antenna shown in FIG. 4a.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

The following embodiments are described for illustrative purposes only with reference to the Figures. Those of skill in the art will appreciate that the following description is exemplary in nature, and that various modifications to the parameters set forth herein could be made without departing from the scope of the present invention. It is intended that the specification and examples be considered as examples only. The various embodiments are not necessarily mutually exclusive, as some embodiments can be combined with one or more other embodiments to form new embodiments.

Figure 2:
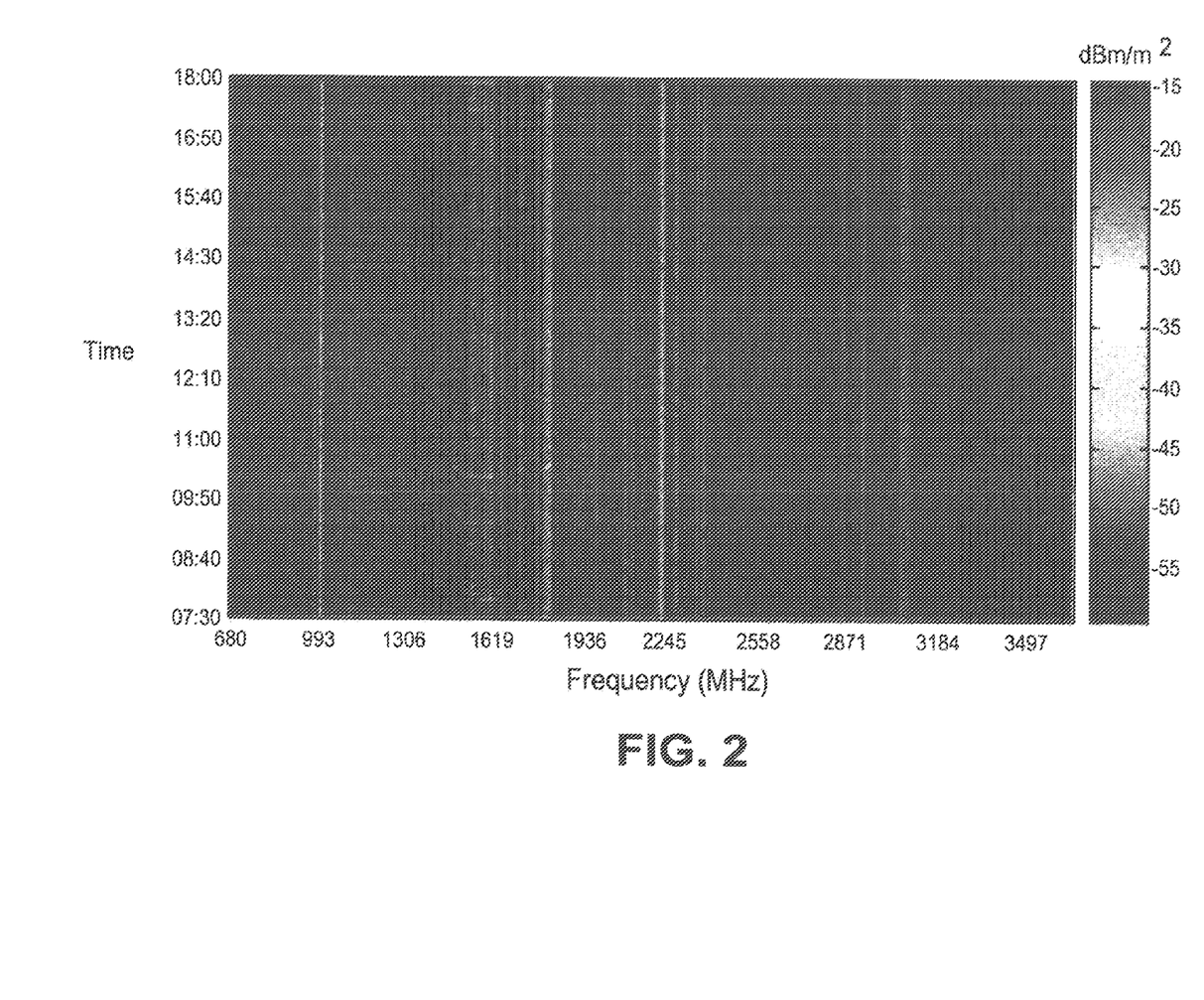
FIG. 2 is a graphical representation of an exemplary ambient RF power density in some urban areas.

As shown in FIG. 2, power density depends on both frequency and time within the 680 MHz-3.5 GHz.band. Thus power density in FIG. 2 varies between 1 $nW/m^2$ and 35.5 $pW/m^2$, depending on the measurement location and time instant. Embodiments described herein can use this ambient RF energy, in combination with solar energy and energy from thermal sources, and convert it into DC power that can be stored in a battery or utilized for any other uses.

Figure 3:
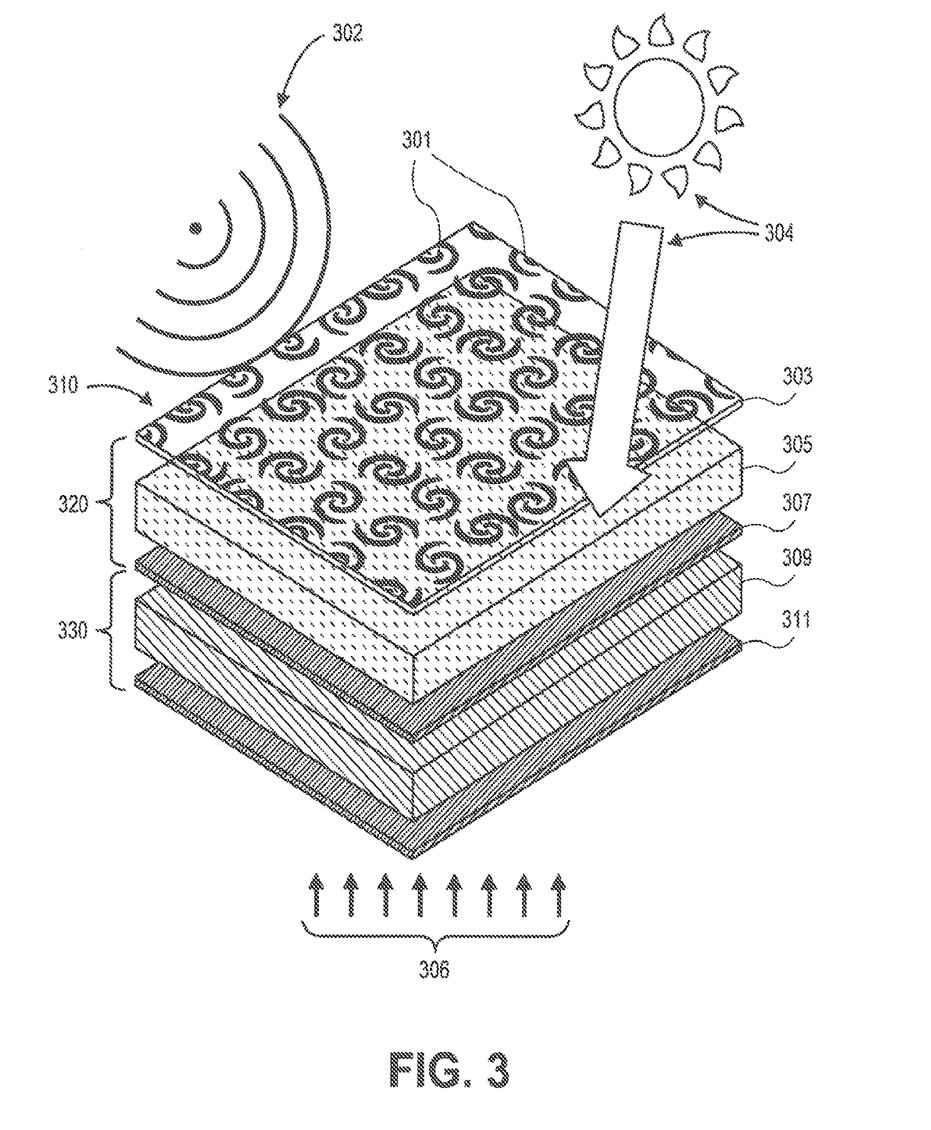
FIG. 3 is a perspective view of a multifunction, reconfigurable energy harvesting device.

FIG. 3 illustrates an embodiment of integrated RF 310, PV (solar) 320 and TPV 330 harvesters that together form device 300. That is, there is a solar cell 320 on which an RF collector 310 layer and TPV cell 330 are integrated as device 300. In other words, an embodiment includes a multifunction, reconfigurable energy harvesting device 300 for harvesting RF energy 302, solar energy 304 and/or ambient heat 306.

The RF, PV and TPV harvesters of embodiments described herein can be in electrical communication with each other and/or with other devices 300. In one example, at least one of the RF, PV and TPV harvesters can be electrically connected in series with at least one of the other RF, PV and TPV harvesters of one of device 300. In another example, at least one of the RF, PV and TPV harvesters can be electrically connected to at least one of an RF, PV and TPV harvesters of one or more other of devices 300. In an embodiment, an array of a plurality of devices 300 are electrically connected to at least some of other devices 300 in said array, or to one or more controllers (not shown) that are capable of activating one or more of the RF, PV and/or TPV harvesters of the devices 300 of the array.

In an embodiment, the RF harvester 310 includes a portion that functions as an electrode for PV 320, for example a top electrode. Likewise, a portion of PV 320, such as a bottom electrode, can function as a top electrode for TPV 330. Additionally, TPV 330 can include more than one TPV. For example, TPV cell 330 can include a first TPV engineered to absorb a first range of IR frequencies and a second TPV engineered to absorb a second range of IR frequencies. In one example, the first and second IR frequencies overlap. In another example, the first and second IR frequencies do not overlap.

RF Harvester

In an embodiment, a multifunction, reconfigurable energy harvesting device 300 can include RF energy harvester 310 that includes at least one of structure 301 or a plurality of structures 301 formed on layer 303. In an embodiment, structures 301 are grown directly on layer 303. In an embodiment structures 301 are in direct contact with layer 303. Structures 301 can serve as antenna elements for receiving a predetermined range of electromagnetic energy frequencies, such as RF frequencies. Each of the structures 301 can include spiral antenna structures such as spiral antenna structures 301' shown in FIG. 4A and further described below. Structures 301, therefore, can function as RF energy 302 absorbers, for example broad-band RF energy absorbers. Layer 303, on which structures 301 are formed, can include a semiconductor or a polymer. Structures 301 can each accept frequencies of RF energy which induces an AC current response therein. The structures can each be connected to a rectifier (described below) to rectify one phase of the AC response therein into a DC response, or connected to two rectifiers, each rectifier converting an opposite phase of the AC response into a DC response that can be combined into a single DC response. Additionally, a rectifier connected to a structure 301 can include a solar cell on which structure 301 is formed.

Figure 4A:
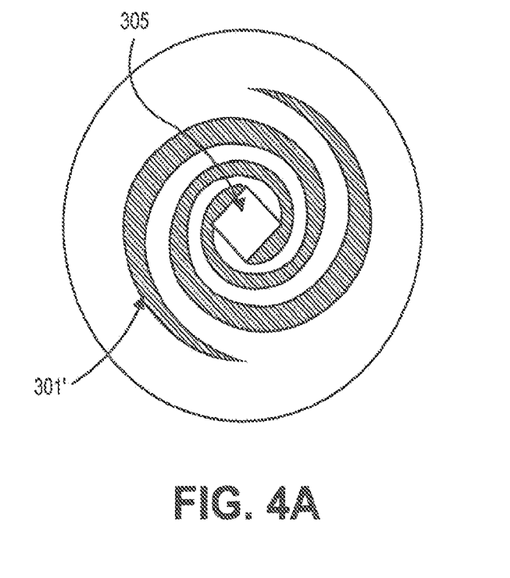
FIG. 4A is a top view of a spiral antenna that can be used as the antenna elements of the device of FIG. 3
Figure 4B:
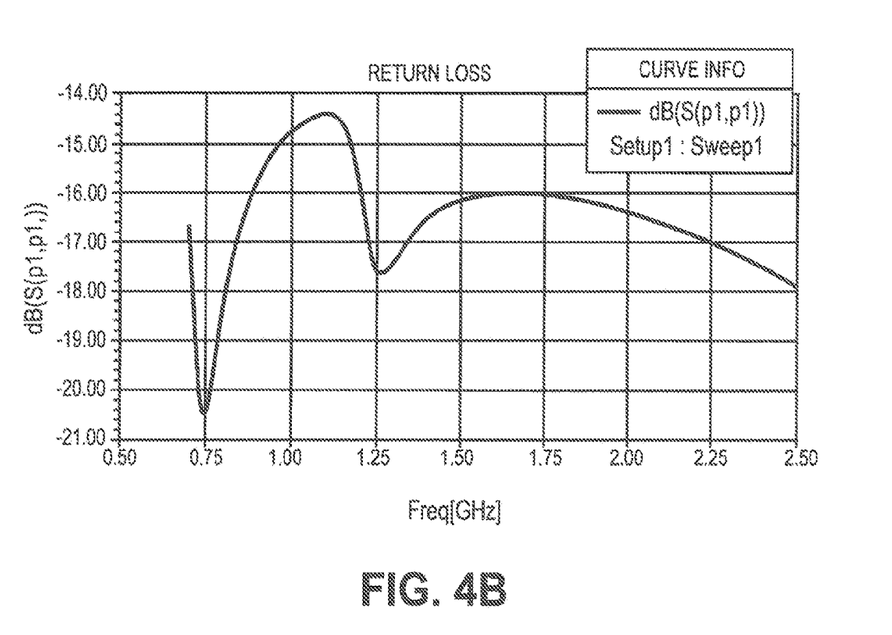

Conversion to DC power ($P_{dc}$) depends on the available RF power ($P_{RF}$) and conversion efficiency ($\eta_{RF/DC}$) from RF to DC power. $P_{dc}=\eta_{RF/DC}P_{RF}$. The choice of the antenna and how well the antenna is matched to the rectifier are very critical in optimizing ($P_{dc}$) from the incident ambient RF wave. Thus, in an embodiment, each one of structures 301 can be spiral antenna structures 301' as shown in FIG. 4a. Spiral antenna structure 301' has wideband properties (shown in FIG. 4B) which will allow it to harvest RF energy from 700 MHz (TV band) up to 3 GHz. Each antenna structure 301' can be matched to a rectifier 405 and the dimensions of the spiral antenna can be optimized to achieve maximum DC power ($P_{dc}$).

Returning to FIG. 3, in an embodiment an array of structures 301 can be spiral antennas for harvesting energy over the entire surface of the harvesting device 300.

Solar (PV) Cell

In an embodiment, a multifunction, reconfigurable energy harvesting device 300 can include solar cell (a/k/a photovoltaic or PV) 320. PV 320 can include layer 303 as a PV top contact, an inorganic or organic semiconductor active layer 305 configured to accept solar energy 304 and convert it to electrical energy, and a bottom layer 307 that includes metal contacts. As described above, layer 303 can serve as a substrate on which structures 301 can be formed. In an embodiment, layer 303 can be a layer of solar cell 320 (e.g., a top layer of solar cell 320). In an embodiment, therefore, a top layer of solar cell 320 also comprises a layer of RF harvester 310. For example, layer 303 can be formed in direct contact with solar cell active layer 305. Structures 301 can serve not only as RF absorbers for RF harvester 310, but also as metal contacts for solar cell 320. The semiconductor active layer 305 can include at least one selected from a III-V compound semiconductor, silicon, poly-silicon and an organic semiconductor. Layer 307 can be a bottom contact of PV 320, for example, a metal contact. The solar cell can include additional layers between layer 303 and 305 and/or between layer 307 and 305, such as electron and hole transport layers.

Thermophotovoltaic (TPV) Cell

The multifunction, reconfigurable energy harvesting device 300 can include a thermophotovoltaic (TPV) cell 330. The thermophotovoltaic cell 330 can be a low-temperature photovoltaic (LT-TPV). TPV 330 and PV cell 320 can be in electrical communication. TPV 330 can include top layer 307, absorber layer 309 and bottom layer 311. Top layer 307 can serve as an interface layer between solar cell 320 and TPV 330. Layer 307 can electrically connect PV 320 and LT-TPV in series, for example. Accordingly, layer 307 can include a metal or a highly-doped semiconductor. TPV absorber layer 309 can be configured to absorb ambient heat energy 306, for infrared (IR) energy. Bottom layer 311 can serve as a bottom electrode for TPV 330 and as an interface between the LT-TPV and a heat source. In an example, bottom layer 311 can include a metal or a highly-doped semiconductor. TPV 330 can include additional layers between layer 307 and 309 and/or between 311 and 309, for example electron or hole transport layers.

The TPV can include an absorber layer 309 with spectral response structures formed thereon. In an example, the absorber layer comprises an Si layer. In an example, the spectral response structures include epitaxially grown ring-shaped structures that can include Ge. That is, the spectral response structures can include epitaxially grown ring-shaped structures such as those in the shape of structures 501 grown by the method described below and accompanying FIGS. 5A-5E or in Example 1A. Ge rings with size diameters of 100s of nm to microns (700 nm to 1000 µm) can be grown utilizing a growth process described in Example 1A below. The ring size range affects the spectral response of Ge rings to different frequencies of the IR spectrum. By selecting a particular size for spectral response structures, for example, Ge rings formed in a periodic pattern, a particular frequency of IR energy can be harvested. Alternatively, multiple sizes of Ge rings formed in a preselected pattern on a layer to form layer 309, for example, can be employed to harvest a desired band of IR. The structures 301 can include structures 601 grown by the method described below and accompanying FIGS. 6A-6B or Example 1B. The structures 301 can include those defined by structures grown by the nucleation and growth method described below and accompanying Example 1C.

In an embodiment, layer 309 can include GaAs formed on GaSb. For example, layer 309 can be formed by the method described in Example 2 below.

In an embodiment, TPV 330 can include more than one TPV (not shown). For example, TPV cell 330 can include a first TPV engineered to absorb a first range of IR frequencies and a second TPV (not shown) engineered to absorb a second range of IR frequencies. In one example, the first and second IR frequencies overlap. In another example, the first and second IR frequencies do not overlap. For example, a first TPV can include layers 307, 309 and 311 as shown in FIG. 3. Layer 309 can be considered a first absorber layer including Ge ring structures formed on Si as described above and in Example 1A below. Alternatively, layer 309 can include more than one layer. For example, layer 309 can include a first IR absorber layer, a second IR absorber layer and an electrode formed between the first and second absorber layers. In an embodiment in which layer 309 includes more than one layer, a first IR absorber layer can include Ge ring structures formed on Si as described above and in on or more of Examples 1A-1C below, and a second IR absorber layer can include GaAs formed on GaSb as described above and in Example 2 below.

EXAMPLES 1A-1C

Growth of Ge Ring-Shaped Spectral Response Structures on Si Substrates

Ge ring-shaped spectral response structures can be formed using various diffusion/collection "pad" structures on an Si substrate, for example on an Si component of a TPV cell. The examples below describe the growth of Ge ring-shaped spectral response structures using $SiO_2$ beads/spheres (Example 1a), nanofabricated $SiO_2$ pillars (Example 1B), and oxidized Si nanowires (Example 1c) for the progressional control of Ge ring diameters. For example, the ring structure size can be varied from the nanoscale to the microscale in order to create a frequency-selective surface for IR-absorption.

EXAMPLE 1A

Growth of Epitaxial Ge Ring on Si Using $SiO_2$ Diffusion/Collection Spheres

By taking advantage of the low desorption and diffusion barriers of Ge adspecies on $SiO_2$ (0.44±0.03 and 0.24±0.05 eV, respectively) and a unique Ge surface chemistry on chemically oxidized Si, crystalline Ge rings can be grown on Si. To form the unique Ge surface chemistry, the process utilizes a Ge beam, which reacts with $SiO_2$/Si and opens up controllably spaced nanoscale windows in thin $SiO_2$, without the need of using high-resolution lithography. As a result, Ge nucleates selectively on exposed Si within these windows.

Figure 5A:
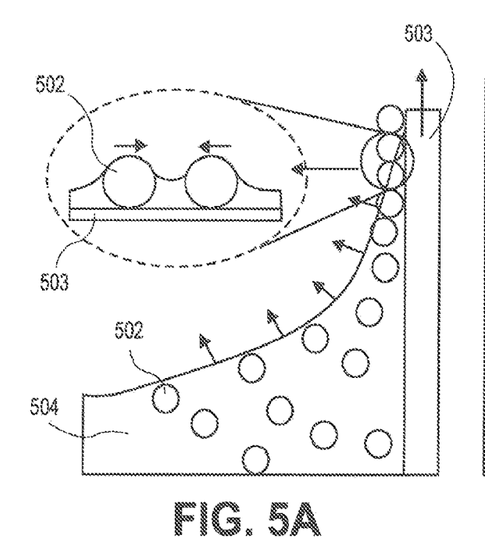
FIGS. 5A-5E illustrate the formation of Ge ring structures on an Si substrate using $SiO_2$ diffusion/collection nanospheres.

FIGS. 5A-5E illustrate the growth of ordered Ge structures 501 over a large area. In an embodiment, structures 301 can include the shape of the Ge structures 501, and/or the Ge structures 501 themselves. In FIG. 5A, a chemically oxidized Si sample substrate 503 is immersed, for example by dip-coating, in an aqueous solution of a colloidal $SiO_2$ sphere suspension 504. Commercially available $SiO_2$ spheres 502 (available from Cabot Corporation, Alpharetta, Ga.) having diameters of >20 nm can be utilized.

Figure 5B:
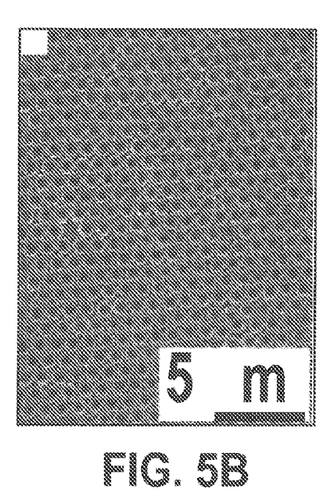
Figure 5C:
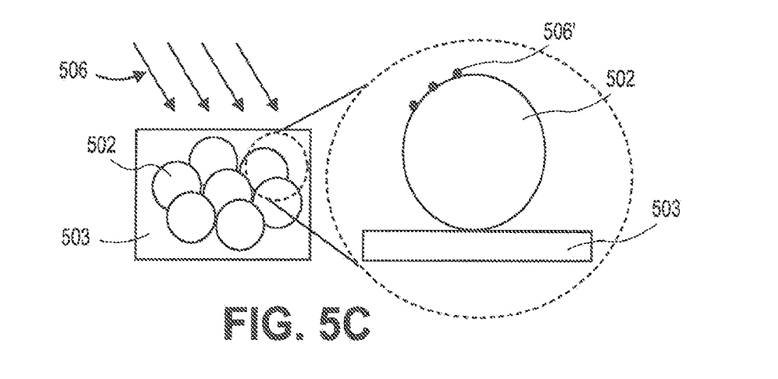

As illustrated in FIG. 5A, the sample substrate 503 is pulled (for example, in a direction indicated by the upward-pointing arrow) from the solution 504 at a very slow rate (20 μm/min), while heated dry air flows over the substrate exposed to the ambient. As the water evaporates from the hydrophilic chemical $SiO_2$ surface, the capillary force (as illustrated in the inset to FIG. 5A) forces the $SiO_2$ spheres 502 to self-assemble into a hexagonally packed monolayer on the substrate surface, as shown in FIG. 5B. The substrate is then loaded into a molecular beam epitaxy chamber for Ge exposure. The incident angle of Ge beam 506 is maintained at 45° with respect to the substrate surface, as illustrated in FIG. 5C. This incident angle ensures that Ge impinges only on the sphere surface, but not on the substrate surface.

Figure 5D:
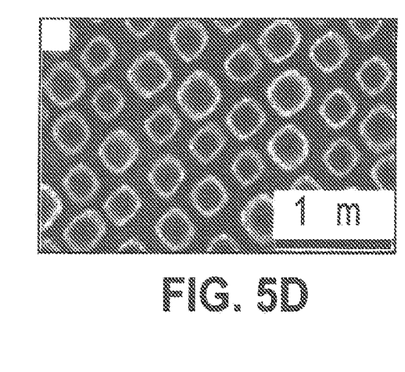
Figure 5E:
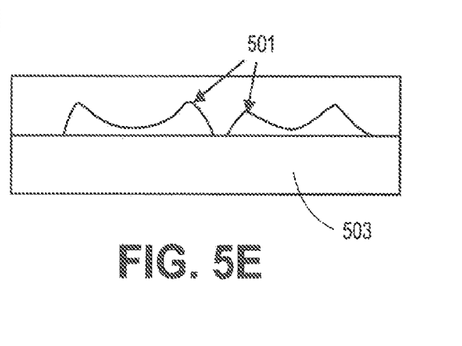

The substrate 503 surface is directly exposed to the beam and Ge islands nucleate and grow between the spheres to suppress the ring formation. The Ge flux is maintained at 1.0 equivalent monolayer (1 eq-ML=$6.3 \times 10^{14}$ atoms/cm$^2$) per minute. The substrate temperature can range from 500 to 600° C. After Ge exposure, the samples are treated in HF solution to dissolve the oxide spheres. With the 45° exposure, the $SiO_2$ spheres serve as collection pads for impinging Ge 506' (as illustrated by the inset in FIG. 5C), while guiding the Ge adspecies to reach the bottom of the spheres. In other words the spheres are used as collection/diffusion pads, and not as shadowing masks typically used in nanosphere lithography. While not intending to be limited to a particular theory, it is believed that the Ge adspecies that arrive at the $SiO_2$ sphere-chemical $SiO_2$ interface form crystalline Ge ring structures 501 on the substrate 503. When the $SiO_2$ is removed in an HF solution, the Ge rings 501 remain on substrate 503 as illustrated by the cross-section shown in FIG. 5E. In other words, the ring structures 501 are revealed by removing the SiO2 as shown in FIG. 5D-5E. Since random nucleation of Ge is not observed between rings (indicated by the dark areas between the rings in FIG. 5D), it is believed that the impinging Ge atoms that are deflected from the $SiO_2$ spheres (i.e., non-adsorbed Ge atoms) and do reach the substrate are negligible. AFM, SEM, and TEM can be used to determine that the Ge rings 501 are approximately 60 nm tall and 300 nm in diameter with no apparent dislocations as shown in FIG. 5E, and that the crystallographic orientation reflects that of the underlying Si in layer 503.

EXAMPLE 1B

Growth of Epitaxial Ge Rings on Si Using $SiO_2$ Diffusion/Collection Pillars

Figure 6A:
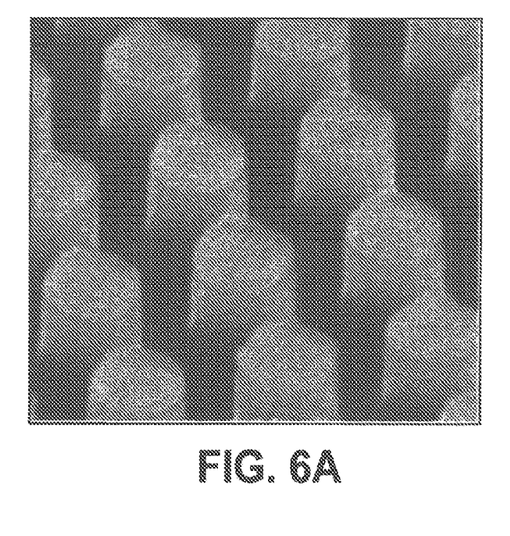
FIGS. 6A-6B illustrate the formation of Ge ring structures on an Si substrate using $SiO_2$ pillars.
Figure 6B:
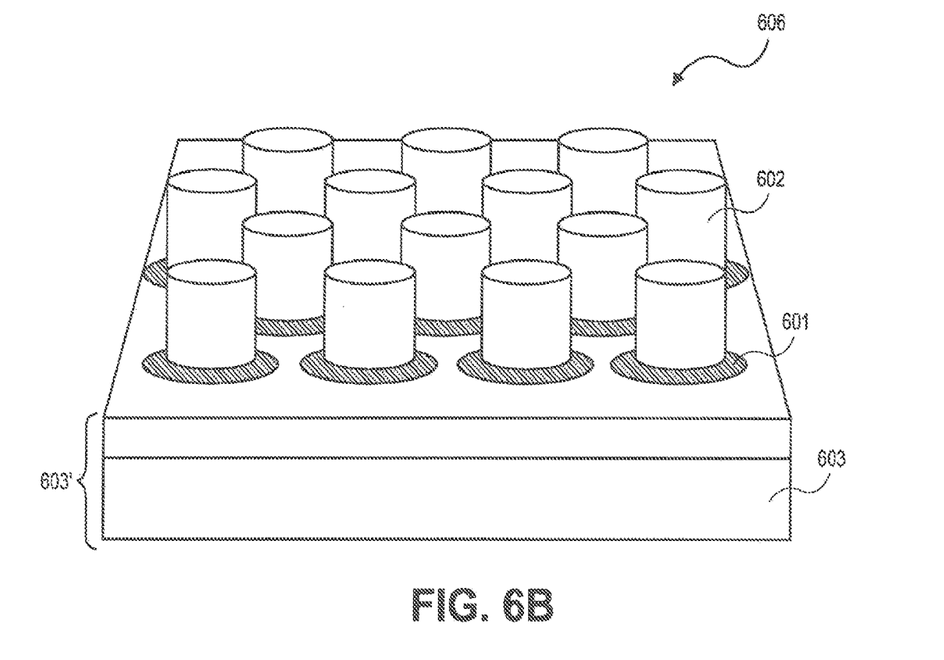

In order to achieve the flexibility of growing Ge rings arranged in any desired periodic pattern, other than hexagonal packing, microfabricated $SiO_2$ pillars 602 can be utilized (as shown in FIGS. 6A-6B) instead of the $SiO_2$ spheres 502 described in Example 1A. The $SiO_2$ pillars can be patterned by conventional lithography and dry etching (e.g., reactive ion etching and other conventional plasma etching techniques). As shown in FIG. 6B, $SiO_2$ pillars 602 formed from a $SiO_2$/Si stack with subsequent chemical oxidation 603' of an exposed Si substrate 603 can be used. This method allows for precisely controlling the location and size of the Ge rings 601 by arranging the $SiO_2$ pillars 602 in a desired pattern before they are exposed to a Ge beam 606. Ge beam flux can range from 1E9 atoms per cm2 per sec to 1E13 atoms per cm2 per sec, while the substrate temperature can vary from 300° C. to 600° C.

EXAMPLE 1C

Growth of Epitaxial Ge Rings on Si Using Si Diffusion/Collection Nanowires

In order to reduce the ring size to the level of 3-D quantum confinement, Ge rings can be grown around $SiO_2$ nanopillars. To form the $SiO_2$ nanopillars, Si nanowires can be grown on a Si substrate by conventional vapor-liquid solid (VLS) growth) using gold nanoparticles under a gas precursor, such as silane ($SiH_4$). The outer surface of the Si nanowires can then be oxidized to form the $SiO_2$ nanopillars. Ge can be grown around the nanopillars using molecular beam epitaxy. This allows the ring dimension to be reduced substantially below 20 nm in diameter. Additionally, this nanowire-based growth strategy enables the method to controllably expand the Ge ring size range from microscale to nanoscale.

EXAMPLE 2

Antimonide Based TPV Integration on III-V and Silicon Solar Cells

Conventional TPV technology is based on homo-epitaxial methods, such as the growth of InGaAsSb on GaSb substrates. However, enormous untapped potential exists for epitaxial processes that integrate dissimilar materials, enabling new device functionality or multi-functionality on a single platform. A prime example of this technology is the growth of GaSb on GaAs, which could have significant impact on TPV technology. The primary obstacles towards integration of these different material systems is of course lattice mismatch, thermal expansion coefficient mismatch, and the defect formation that ensues. As described in the below examples, embodiments described herein overcome these challenges.

EXAMPLE 2

Growth of GaSb on GaAs

In the case of certain highly mismatched semiconductors such as GaSb on GaAs the transition from a lattice constant of 5.65 Å to 6.09 Å can be achieved without growing as much as a single mono-layer of GaSb on GaAs. This is realized through the use of certain multi-layer surface reconstructions of Sb on GaAs that form complete planar layers of the Sb-sublattice on the GaAs substrate, thus surpassing the critical thickness for the materials involved. This results in a periodic 90°-misfit dislocation array in the Sb layer to accommodate the strain. A (2×8) Sb reconstruction on Ga-terminated GaAs is one such reconstruction that possesses the ability to pack Sb atoms two-dimensionally on the GaAs substrate, in the process forming an array of 90° misfit dislocations. Since these periodic misfit dislocations allow Sb atoms on GaAs to take on the lattice constant of GaSb, the ensuing GaSb growth on such a reconstructed surface is similar to GaSb homoepitaxy. The reconstruction's ability to self-assemble and dynamically change its coverage on the substrate allows for a monolayer of completely relaxed GaSb to be realized across the entire GaAs substrate. This unique growth mode adds antimonide TPV's to the mature GaAs substrate platform. Furthermore, this technology will also allow for the realization of integrated PV-TPV technologies on GaAs substrates.

Switching Between the Harvesting of More Desirable and Less Desirable Energy Sources An energy harvesting system described in at least one embodiment is configured to receive energy from at least one of several renewable energy sources, convert the energy into electrical power to be stored and/or used. An energy harvester system described in at least one embodiment can also be configured to switch, using for example, a reconfigurable system, between harvesting energy from one or more of a less desirable source of energy to harvesting energy from one or more of a more desirable source of energy. Such a switch can be made to depend on, for example, the amount of energy available from a given source of energy, and an efficiency value of harvesting energy from that particular source using a particular type of energy harvester. Accordingly, an energy harvester of embodiments described herein can optimize harvesting power, i.e. maximize the percent of incident radiation captured with the antenna or array. In one embodiment, the inventive harvester maximizes capture for certain range of frequencies of RF power.

For embodiments described herein, an optimum range/capture profile is maximized. The range/capture profile is a function of a structure 301, such as antenna spiral structure 301'. Additionally, it is noted that there can be an advantage to optimizing over some restricted areas of the device versus over the entire surface including the possibility that an antenna array is spread over the entire exterior of a device.

As described above, energy harvesters of embodiments described herein are capable of switching between different energy harvesting states, or between different electrical states that may be more or less efficient under given environmental conditions, based on, in part, harvesting energy from one or more sources of a less desirable energy source and/or harvesting energy from one or more sources of a more desirable energy source, including RF, solar and heat (IR) energy. As explained below, the harvesting devices of embodiments can also change the directionality of power harvesting or electrical connections between the devices.

Device Level Electrical Reconfigurability

Figure 7A:
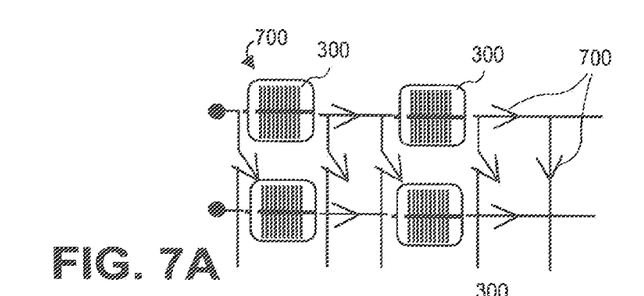
FIGS. 7A-7C illustrate electrical connection configurations between an array of energy harvesters.
Figure 7B:
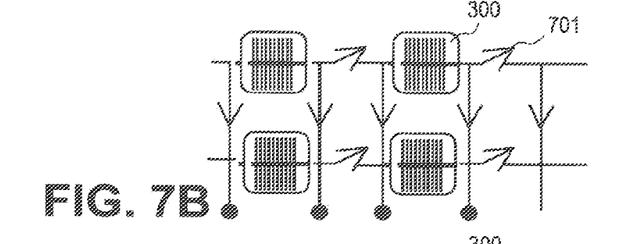
Figure 7C:
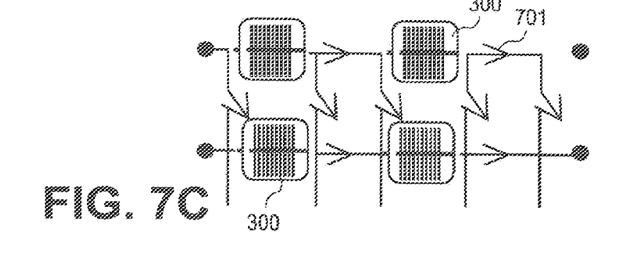

It is desired that every switching operation should not come at a "price" of exerting a lot of energy. Hence, a low-cost, low profile, low power consumption, long-lifetime switch matrix is useful for controlling electrical connections between a plurality of energy harvesters 300. As shown in FIGS. 7a-7c, switches 701 can be incorporated at different locations along electrical connections between the solar cells of the energy harvesters 300 as part of a larger interconnected array 700 of interconnected harvesters.

Figure 8A:
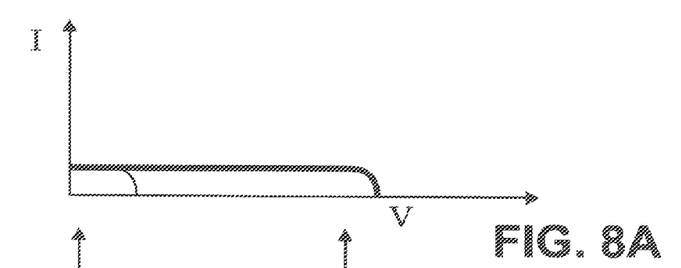
FIGS. 8A-8C illustrate corresponding load curves for the array of energy harvesters of FIGS. 7a and 7c.
Figure 8B:
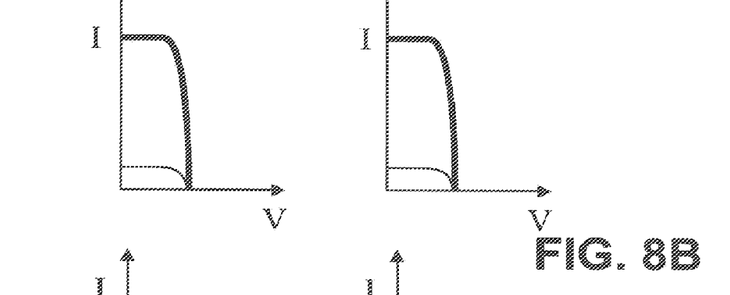
Figure 8C:
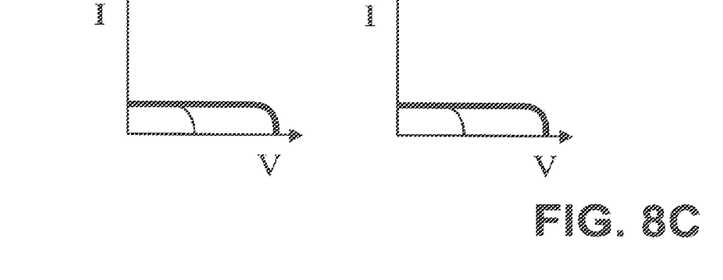

Various scenarios for harvesting and using energy require different load curves (e.g., high voltage & low current as shown in FIG. 8a, vs. low voltage & high current as shown in FIG. 8b, vs. hibernation as shown in FIG. 8c). Throughout the lifetime of a device, such scenarios may occur from only several times (complete rebooting of the system), to hundreds thousand times (daily power cycling, or response to running applications, weather conditions/cloud cover). The ability to switch between load curves is beneficial for switching between the need to charge quickly at higher current (for example, at full sunlight), to the need to power up a different RF or TPV harvesting mode at a higher voltage, or a combination of them. Multiple switching mechanisms can be incorporated into the structure of the energy harvesters of the embodiments described here in. For example, switching mechanism, can include, but not limited to: bubble switch, thermo-electric, MEMS, etc. Additionally, a switching device used in a reconfigurable fabric can have minimum area (and weight), exhibits minimum parasitic resistance, and can be easily controlled.

Figure 9:
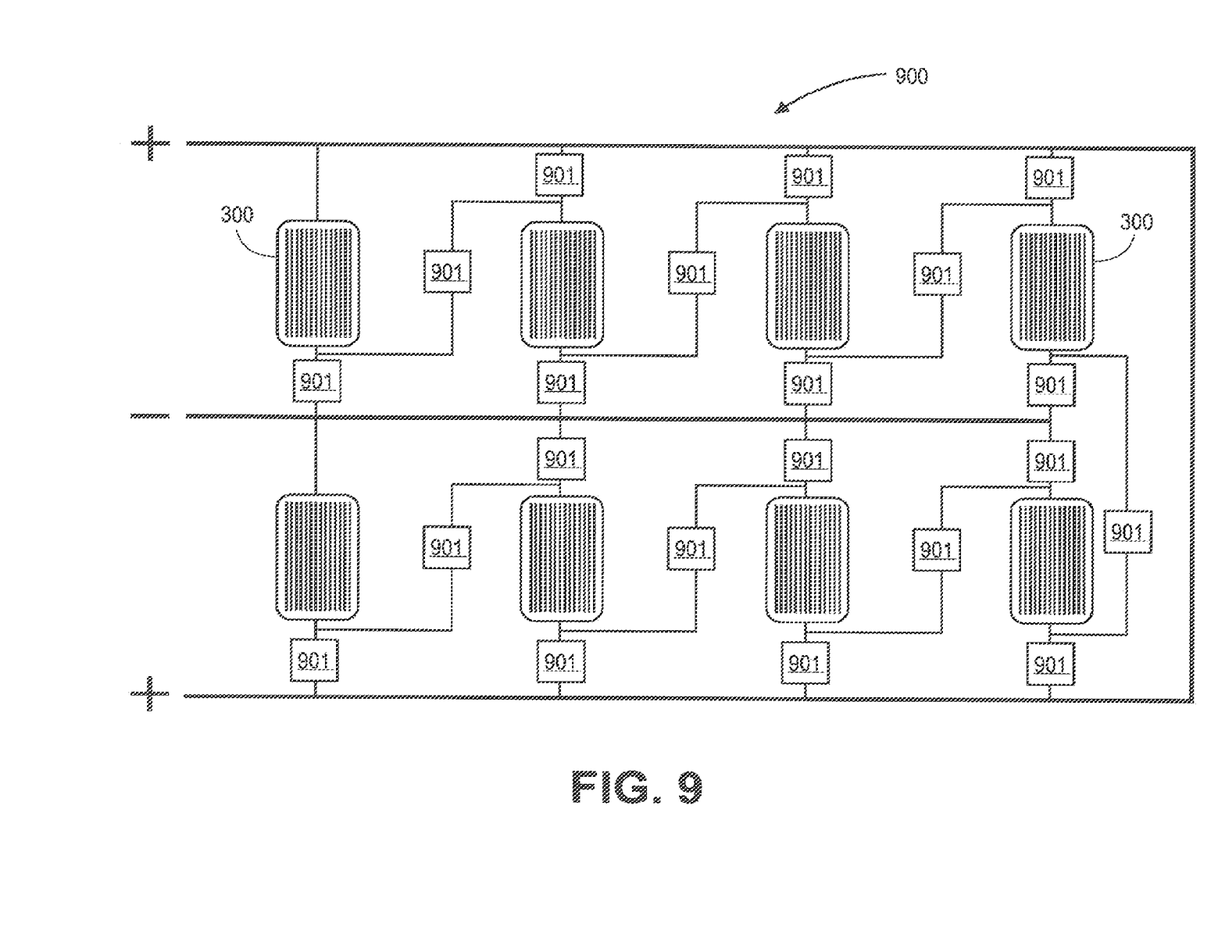
FIG. 9 illustrates an array of energy harvesters in an interconnecting switching control network.

A switch can be a semiconductor CMOS switch using 0.35 um TSMC CMOS process through MOSIS. Each switch can, for example, contain a CMOS switching device 901 such as an Addressable Power Switch (APS) and a small deserializer and address decoder that enables the switch to be controlled by only one serial command through a control network, such control network 900 of interconnected energy harvesters 300 as shown in FIG. 9. Utilizing this networking architecture for control signals reduces the number of control signal wires and therefore the weight of the system. Note that, unlike shown in FIG. 9, only one or two switches may be required for a small portable power-harvesting device.

Device Level Directional Reconfigurability

Directional reconfigurability can be provided to the energy harvesters of the embodiments described herein. For example, even a small angle increment may make a significant performance improvement (>10%), in case of solar radiation. The energy harvesters of the embodiments described herein can be provided with the ability to automatically be pointed in the direction of a dominant, or more desirable, energy source. Thermal or bubble switches can be used for directional reconfigurability. The harvester can control the tilt of the solar or RF surfaces to maximize the power by activating the bubble or thermal switches.

Functional Reconfigurability

Figure 10:
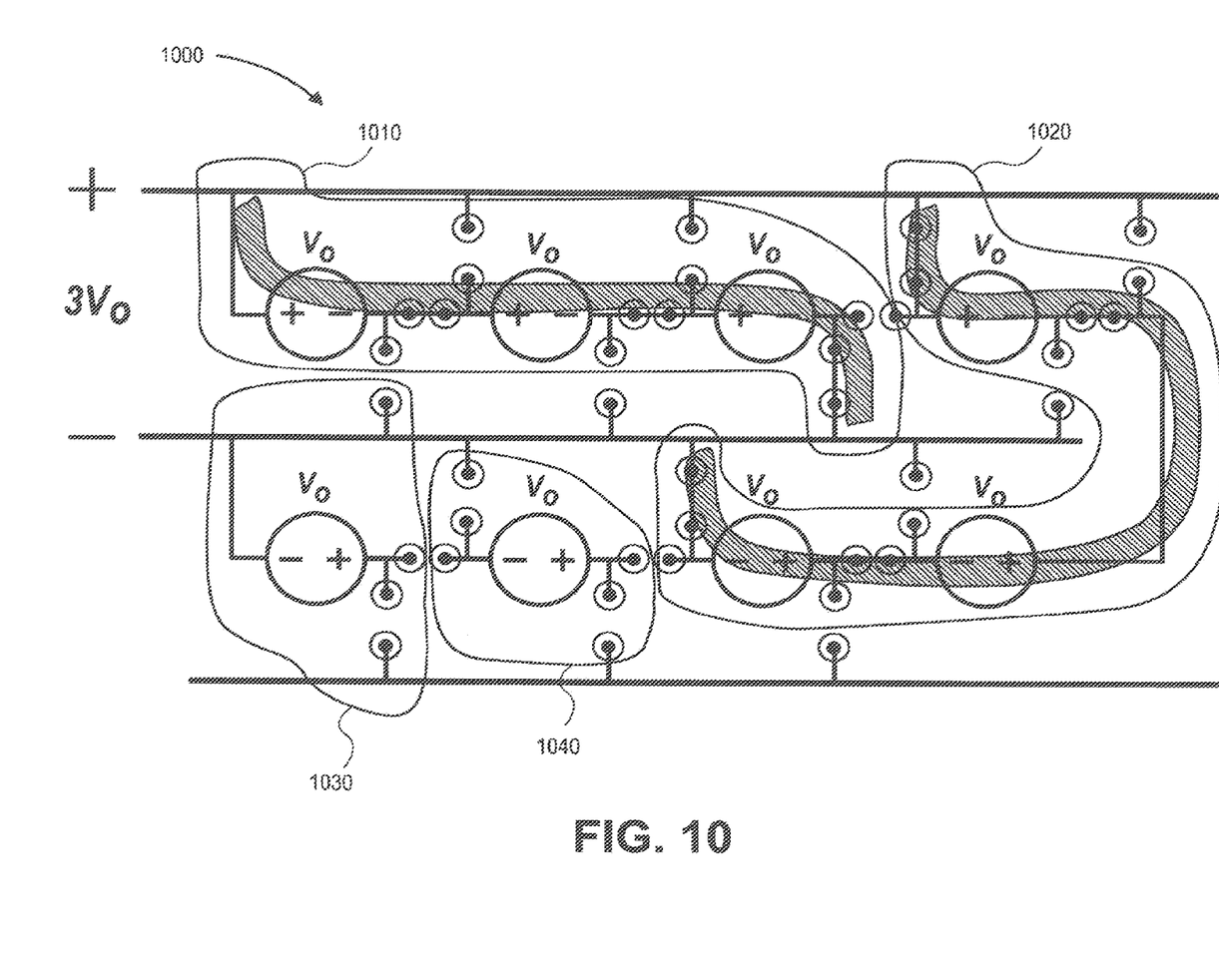
FIG. 10 illustrates energy harvesting paths, representing harvesting from solar and RF Sources.

For an efficient operation of the energy harvester of the embodiments, it can harvest from the most efficient energy source, or a combination of several of them at the same time. In the switching control network architecture of FIG. 9, for example, various interconnected energy harvesting sources 300 can be treated as voltage (or current) sources, and be connected according to the current state of the system and environment. FIG. 10 illustrates energy harvesting paths 1010 and 1020, representing harvesting from solar and RF sources, respectively. Energy harvesting paths 1030 and 1040, on the other hand are not connected and not active, representing for example, energy harvesting from TPV and vibration.

Unlike an optical, truly-non-blocking N×N crossbar switch (that requires $N^2$ elements), not all paths are required for changing electrical operating point or optimal charging paths. The embodiments can use the minimum number of switches to maintain optimal switching for energy harvesting, considering the trade-offs (power penalty, complexity) for introducing additional switches.

Objective Function

The optimizations and switching functions described above can be implemented by a controller which is in electrical communication with harvesting device of the embodiments. The controller, for example a computer, can utilize instructions stored on a computer readable medium. The instructions can include a computer program representing an algorithm for calculating an objective function that determines the total output energy, E, of the harvesting device, and operations required by the controller to maximize E over certain time intervals. In other words, the controller can manipulate the harvesting device such that the integrated power output is maximized.

In one example, such as a statically deployed energy harvester, the program stored on a computer readable medium is read by a computer of the controller, and the controller is caused to manipulate the energy harvester such that it is continuously harvesting energy. In another example, such as a harvester deployed for mobile uses, the program stored on a computer readable medium is read by a computer of the controller, and the controller is caused to manipulate the energy harvester such that it adapts to rapidly changing environments where discontinuous harvesting is crucial.

Accordingly, the objective function in its most general form can be expressed as a sum of power inputs integrated over a period of time, $$E[x(t), y(t), \tau(t); \alpha] = \sum_i \int_{t \in \tau_i} P_i(x_i(s), y_i(s); \alpha_i) ds$$

where E the total energy output over a characteristic time period (e.g. a day), x(t) is the vector of environmental factors, a presumably given function of time, $y(t)=(y_1(t) \ldots y_N W)$ are a collection of time-varying performance controls for each component, $\alpha=(\alpha_1 \ldots \alpha_N)$ a collection of fixed (design) control parameters, $\tau_i(t)$ is the characteristic function for the time interval of operation of the i-th component, $P_i$ the instantaneous power output of the i-th component, the goal of the present optimization is to define basic explicit forms for:

(1) power function for solar (P=fn(Intensity, angle, temperature, other ambient factor))
(2) power function for RF P=fn(Intensity, polarization, temperature, other ambient factor).
(3) power for IR P=fn(Intensity, spectral composition, temperature, other ambient factor)

In addition, it is expected that the various components will not be operating independently, so that the maximization of the total energy output can entail some penalties. For example, switching over among various modes of operation might entail power expenditure (in which case some of the elements added in the above sum may be negative) or there might be a coupling among the characteristic intervals of operation. At this stage we can include this in the form of a set of constraints among the unknown functions and parameters (y(t) τ(t) α), $c_k(y,\tau,\alpha)=0$, k=1, . . . , M.

Depending on the type (e.g. equality, inequality) and number of constraints, techniques of constrained optimization theory can be used. The type of numerical techniques that are employed will depend on the characteristics of the power functions, sources and design (e.g. stochastic inputs, discontinuous controls etc.) and are part of the invention. The invention includes a framework for optimizing switching among modes of operation, with presumed known switching penalty functions, assuming smooth behavior. The invention can involve inputs of known stochastic characteristics with an extension of the methods to encompass the possibility of stochastic switching strategies.

While the invention has been illustrated respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function.

For example, the embodiments described herein are capable of receiving, storing, and/or collecting various sources of energy, including man-made and naturally available energy sources in various settings, such as urban settings.

Embodiments described herein can be incorporated into various devices that require electrical power. For example, the integrated RF-PV-TPV harvesters in electrical communication with a controller can be integrated with the electrical system of a cell phone.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of three A, B and C.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An energy harvesting device, comprising:
    a solar cell comprising at least one active layer for receiving a first range of electromagnetic frequencies;
    an RF harvester comprising at least one layer comprising antenna structures for receiving RF energy and formed on a first side of the solar cell, and
    a thermophotovoltaic cell comprising at least one semiconductor for absorbing IR energy and formed on a second side of the solar cell opposite the first side,
    wherein the at least one semiconductor comprises epitaxially grown, ring-shaped spectral response structures.

2. The energy harvesting device of claim 1, wherein the antenna structures comprise spiral antenna structures capable of capturing RF energy with frequencies of 700 MHz up to 3 GHz.

3. The energy harvesting device of claim 1, wherein the spectral response structures comprise diameters in a range of 700 nm to 1000 μm.

4. The energy harvesting device of claim 1, wherein the spectral response structures comprise crystalline Ge.

5. The energy harvesting device of claim 1, wherein the active layer comprises an inorganic semiconductor.

6. The energy harvesting device of claim 1, wherein the at least one semiconductor includes
    a first semiconductor for absorbing a first range of IR frequencies and
    a second semiconductor for absorbing a second range of IR frequencies.

7. The energy harvesting device of claim 1, wherein the first range of electromagnetic frequencies comprises a range including ultraviolet and visible light.

8. The energy harvesting device of claim 1 wherein the at least one semiconductor layer comprises Si.

9. The energy harvesting device of claim 1, wherein the at least one semiconductor comprises
    a first IR absorber layer comprising Ge ring structures formed on Si; and
    a second IR absorber layer comprising GaAs on GaSb.

10. The energy harvesting device of claim 1, wherein the at least one layer of RF harvester comprises a semiconductor.

11. The energy harvesting device of claim 1, wherein active layer comprises an organic semiconductor.

12. The energy harvesting device of claim 1, wherein the spectral response structures comprise multiple sizes of Ge rings for absorbing different IR frequencies.

* * * * *